(12) United States Patent
Mizutani et al.

(10) Patent No.: US 11,375,637 B2
(45) Date of Patent: Jun. 28, 2022

(54) HEAT SINK

(71) Applicant: Mitsubishi Electric Corporation, Tokyo (JP)

(72) Inventors: Shuhei Mizutani, Tokyo (JP); Takanori Koike, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 173 days.

(21) Appl. No.: 16/610,569

(22) PCT Filed: Jul. 3, 2017

(86) PCT No.: PCT/JP2017/024348
§ 371 (c)(1),
(2) Date: Nov. 4, 2019

(87) PCT Pub. No.: WO2019/008634
PCT Pub. Date: Jan. 10, 2019

(65) Prior Publication Data
US 2020/0154603 A1   May 14, 2020

(51) Int. Cl.
*F28F 7/00* (2006.01)
*H05K 7/20* (2006.01)

(52) U.S. Cl.
CPC ..... *H05K 7/20272* (2013.01); *H05K 7/20254* (2013.01)

(58) Field of Classification Search
CPC ............ H05K 7/20272; H05K 7/20254; H01L 23/40; H01L 23/46; H01L 23/473; F28D 2021/0028; F28D 2021/0029

USPC ......................................................... 165/80.4
See application file for complete search history.

(56) References Cited

U.S. PATENT DOCUMENTS

| | | | | |
|---|---|---|---|---|
| 3,971,435 A | * | 7/1976 | Peck | F28D 15/046 361/689 |
| 4,520,305 A | * | 5/1985 | Cauchy | F28D 15/0275 310/306 |
| 4,791,983 A | * | 12/1988 | Nicol | H01L 23/473 257/E23.098 |
| 6,102,110 A | * | 8/2000 | Julien | H01L 23/427 361/679.52 |
| 7,044,201 B2 | * | 5/2006 | Cho | F28D 15/046 174/15.2 |
| 7,602,610 B2 | * | 10/2009 | Ueda | G06F 1/203 165/80.4 |

(Continued)

FOREIGN PATENT DOCUMENTS

| | | |
|---|---|---|
| JP | 4766283 B2 | 9/2011 |
| JP | 2015-075258 A | 4/2015 |
| JP | 5747968 B2 | 7/2015 |

*Primary Examiner* — Claire E Rojohn, III
(74) *Attorney, Agent, or Firm* — Posz Law Group, PLC

(57) ABSTRACT

A heat sink includes a pipe through which cooled fluid flows and a cooling block having a first face on which the pipe is placed and a second face to which a heat emitting element is attached. The cooling block has a contact region and a noncontact region at positions where the cooling block faces the pipe. In the contact region, the first face contacts the pipe. In the noncontact region, the first face faces the pipe with a gap therebetween. The contact region is included in a projection region defined by projecting a region of attachment of the heat emitting element onto the first face.

6 Claims, 3 Drawing Sheets

(56) References Cited

U.S. PATENT DOCUMENTS

| | | | | |
|---|---|---|---|---|
| 7,866,376 B2* | 1/2011 | Jiang | ............ | H01L 23/467 |
| | | | | 165/104.33 |
| 8,161,644 B2* | 4/2012 | Lin | ............ | F28D 15/0266 |
| | | | | 29/890.032 |
| 8,225,847 B2* | 7/2012 | Li | ............ | H01L 23/427 |
| | | | | 165/80.3 |
| 9,784,506 B2* | 10/2017 | Teraki | ............ | F28F 9/013 |
| 10,677,478 B2* | 6/2020 | Park | ............ | F24F 1/24 |
| 2005/0139347 A1* | 6/2005 | Chen | ............ | H01L 23/427 |
| | | | | 257/E23.099 |
| 2007/0002537 A1* | 1/2007 | Tomioka | ............ | G06F 1/203 |
| | | | | 361/695 |
| 2008/0035310 A1* | 2/2008 | Hsu | ............ | H01L 23/427 |
| | | | | 165/104.21 |
| 2010/0020501 A1* | 1/2010 | Li | ............ | F28D 15/0275 |
| | | | | 361/710 |
| 2011/0203773 A1* | 8/2011 | Teraki | ............ | F28F 3/12 |
| | | | | 29/890.035 |
| 2013/0228312 A1* | 9/2013 | Wu | ............ | F28D 15/0275 |
| | | | | 29/890.03 |
| 2015/0082823 A1* | 3/2015 | Teraki | ............ | H05K 7/20254 |
| | | | | 361/699 |
| 2015/0116942 A1 | 4/2015 | Teraki et al. | | |
| 2015/0128631 A1* | 5/2015 | Oguri | ............ | H01L 23/473 |
| | | | | 62/259.2 |
| 2015/0271953 A1* | 9/2015 | Fujiwara | ............ | H01L 33/648 |
| | | | | 165/80.4 |
| 2016/0238285 A1* | 8/2016 | Kawano | ............ | F25B 41/24 |
| 2016/0330876 A1* | 11/2016 | Fujiwara | ............ | F25B 31/006 |
| 2017/0049008 A1* | 2/2017 | Pascall | ............ | C25D 15/00 |
| 2018/0187905 A1* | 7/2018 | Doi | ............ | F25D 31/00 |
| 2019/0051581 A1* | 2/2019 | Tsunoda | ............ | F28D 15/0275 |
| 2020/0373218 A1* | 11/2020 | Guo | ............ | H01L 23/4006 |

* cited by examiner

HEAT SINK

CROSS REFERENCE TO RELATED APPLICATION

This application is a U.S. national stage application of International Application No. PCT/JP2017/024348, filed on Jul. 3, 2017, the contents of which are incorporated herein by reference.

TECHNICAL FIELD

The present invention relates to a heat sink including a pipe through which cooled fluid flows.

BACKGROUND

Heat sinks to cool an electronic part are known in the art. Such heat sinks known in the art include a heat sink including a pipe through which cooled fluid flows and a cooling block made of a heat conductive material (refer to, for example, Patent Literature 1). As disclosed in Patent Literature 1, the heat sink includes the cooling block having a placement groove and the pipe pressed against the groove, plastically deformed, and fitted in the groove with no gap therebetween to increase thermal conductivity. A cooling range of the heat sink including the cooling block and the pipe typically depends on the size of the cooling block and the area of contact between the pipe and the cooling block.

The heat sinks known in the art further include a heat sink that is disposed in an air-conditioning apparatus including a refrigerant circuit and cools an electronic part included in a controller by using refrigerant flowing through a pipe included in the heat sink (refer to, for example, Patent Literature 2). In the heat sink disclosed in Patent Literature 2, the flow rate of the refrigerant is adjusted by opening or closing a solenoid valve included in the refrigerant circuit. The electronic part can be kept at a target temperature if the heat sink has a low heat capacity.

PATENT LITERATURE

Patent Literature 1: Japanese Patent No. 4766283
Patent Literature 2: Japanese Patent No. 5747968

In the configuration of the heat sink in Patent Literature 1, excessive cooling may cause condensation to form in the vicinity of a heat-generating electronic part (hereinafter, referred to as a "heat emitting element"). A low heat capacity of the heat sink, as in Patent Literature 2, results in an increase in temperature undershoot and overshoot. This makes it difficult to keep the heat emitting element at the target temperature.

SUMMARY

The present invention has been made to solve the above-described problem and aims to provide a heat sink that certainly achieves cooling while preventing the formation of condensation.

A heat sink according to an embodiment of the present invention includes a pipe through which cooled fluid flows and a cooling block having a first face on which the pipe is placed and a second face to which a heat emitting element is attached. The cooling block has a contact region and a noncontact region at positions where the cooling block faces the pipe. The first face contacts the pipe in the contact region and faces the pipe with a gap therebetween in the noncontact region. The contact region is located within a projection region defined by projecting a region of attachment of the heat emitting element onto the first face.

In the heat sink according to the embodiment of the present invention, the noncontact region is also located at a position where the cooling block faces the pipe. This arrangement allows the cooling block to have a sufficient heat capacity. Additionally, the contact region is located within the projection region of the region of attachment of the heat emitting element. This arrangement reduces or eliminates excessive cooling in peripheral part of the cooling block. The heat sink according to the embodiment of the present invention thus cools the heat emitting element with certainty while reducing or eliminating the formation of condensation.

DETAILED DESCRIPTION

Embodiment 1

Figure 1:
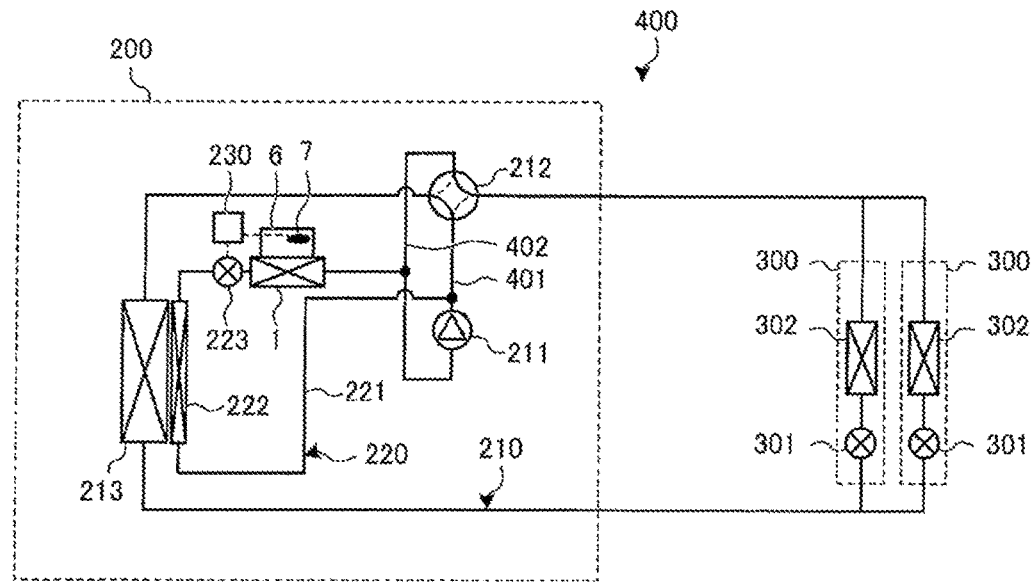
FIG. 1 is a circuit diagram illustrating a heat sink 1 according to Embodiment 1 of the present invention disposed in an air-conditioning apparatus 400.

FIG. 1 is a circuit diagram illustrating a heat sink 1 according to Embodiment 1 of the present invention disposed in an air-conditioning apparatus 400. The air-conditioning apparatus 400 includes a heat source unit 200 and a plurality of load units 300. The heat source unit 200 includes a compressor 211, a flow switching device 212, and a heat source side heat exchanger 213. The heat source unit 200 further includes a controller and a temperature sensor 7 disposed at the controller.

The compressor 211 compresses and discharges refrigerant. The flow switching device 212, which includes a four-way valve, switches between a refrigerant passage for a cooling operation and a refrigerant passage for a heating operation. The heat source side heat exchanger 213, which exchanges heat between the refrigerant discharged from the compressor 211 and air, functions as a condenser in the cooling operation and functions as an evaporator in the heating operation.

The load units 300 each include a load side expansion device 301 and a load side heat exchanger 302. Although two load units 300 are connected to one heat source unit 200 in FIG. 1, one or three or more load units 300 may be connected to one heat source unit 200. The load side expansion device 301, which includes an electronic expansion valve or a capillary tube, reduces the pressure of the refrigerant flowing from the heat source side heat exchanger 213 to expand the refrigerant. The load side heat exchanger 302, which exchanges heat between the refrigerant reduced in pressure by the load side expansion device 301 and air, functions as an evaporator in the cooling operation and functions as a condenser in the heating operation.

The compressor 211, the flow switching device 212, the heat source side heat exchanger 213, the load side expansion devices 301, and the load side heat exchangers 302 are connected by refrigerant pipes, thus forming a main circuit 210 of the refrigerant circuit. Examples of the refrigerant used herein include water, fluorocarbon, ammonia, and carbon dioxide.

The heat source unit 200 includes a bypass 220 to cool a heat emitting element 6 included in the controller with the refrigerant. The bypass 220 includes a precooling heat exchanger 222, a flow control device 223, and the heat sink 1. The precooling heat exchanger 222 is integrated with the heat source side heat exchanger 213. A portion of the heat source side heat exchanger 213 is used as the precooling heat exchanger 222. The precooling heat exchanger 222 cools the refrigerant diverted from the main circuit 210. The flow control device 223, which includes an electronic expansion valve having a variable opening degree, reduces the pressure of the refrigerant cooled by the precooling heat exchanger 222 to expand the refrigerant. The heat sink 1 cools the heat emitting element 6 of the controller with cooling energy of the refrigerant reduced in pressure by the flow control device 223. The term "heat emitting element 6" as used herein refers to a heat-generating electronic part of electronic parts included in the controller.

In the bypass 220, the precooling heat exchanger 222, the flow control device 223, and the heat sink 1 are connected by a bypass pipe 221. The bypass pipe 221 branches off from a high-pressure pipe 401 extending between the compressor 211 and the flow switching device 212 and connects to a low-pressure pipe 402 on a suction side of the compressor 211. Although the flow control device 223 is disposed on an inlet side of the heat sink 1 in FIG. 1, the flow control device 223 may be disposed on an outlet side of the heat sink 1. In a case where the flow control device 223 is disposed on the inlet side of the heat sink 1, the refrigerant cooled by the precooling heat exchanger 222 is reduced in pressure by the flow control device 223, so that the temperature of the refrigerant is lowered. Then, the refrigerant flows into the heat sink 1.

The controller controls, for example, a frequency of the compressor 211, switching of the flow switching device 212, and an opening degree of each load side expansion device 301. The controller includes a cooling control unit 230 that controls the opening degree of the flow control device 223 on the basis of the temperature of the heat emitting element 6 detected by the temperature sensor 7. Specifically, the cooling control unit 230 performs control to open the flow control device 223 when the temperature of the heat emitting element 6 is at or above an upper temperature limit and close the flow control device 223 when the temperature of the heat emitting element 6 is at or below a lower temperature limit. For example, the upper temperature limit is set based on a heat resistance temperature of the electronic parts and the lower temperature limit is set based on a temperature at which condensation forms on the heat emitting element 6.

High-pressure gas refrigerant discharged from the compressor 211 flows through the main circuit 210 and exchanges heat with the air in the load units 300, thereby performing cooling or heating. When the temperature of the heat emitting element 6 rises to or beyond the upper temperature limit, the cooling control unit 230 performs control to open the flow control device 223, so that part of the high-pressure gas refrigerant discharged from the compressor 211 flows into the bypass pipe 221.

The high-pressure gas refrigerant flowing through the bypass pipe 221 is cooled into liquid refrigerant by the precooling heat exchanger 222 and is reduced in pressure by the flow control device 223. Then, the refrigerant flows into the heat sink 1. The liquid refrigerant that has flowed into the heat sink 1 absorbs heat generated from the heat emitting element 6 and thus turns into gas refrigerant. Then, the refrigerant flows into the bypass pipe 221. The gas refrigerant leaving the heat sink 1 passes through the bypass pipe 221 and is then sucked into the compressor 211. In this case, when the temperature of the heat emitting element 6 is at or above the upper temperature limit, the cooling control unit 230 causes the refrigerant to flow into the bypass 220, thereby cooling the heat emitting element 6. When the temperature of the heat emitting element 6 is at or below the lower temperature limit, the cooling control unit 230 keeps the refrigerant from flowing into the bypass 220.

Figure 2:
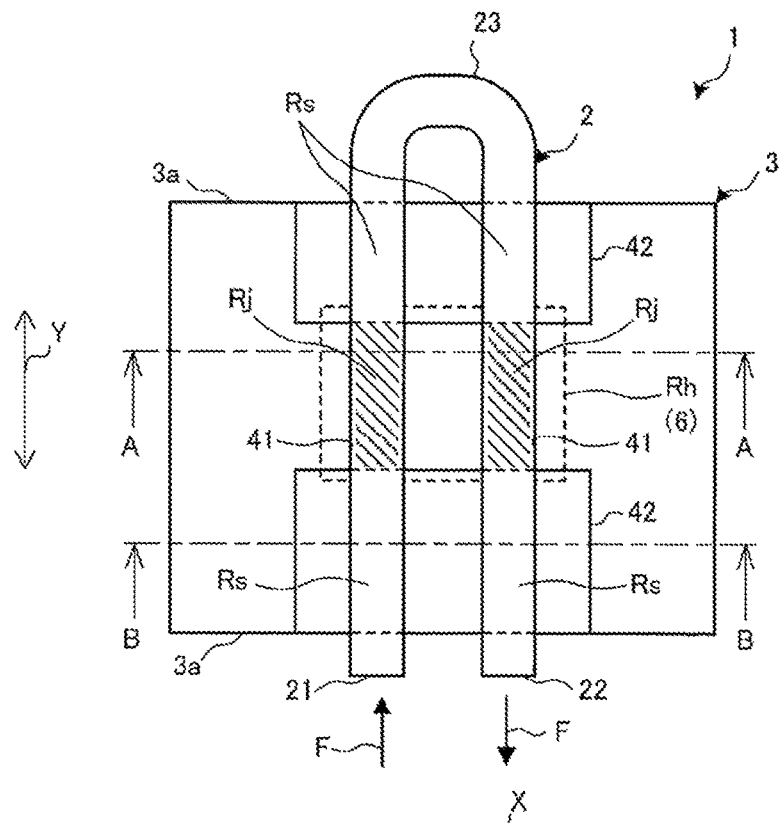
FIG. 2 is a plan view illustrating a schematic configuration of the heat sink 1 according to Embodiment 1 of the present invention.
Figure 3:
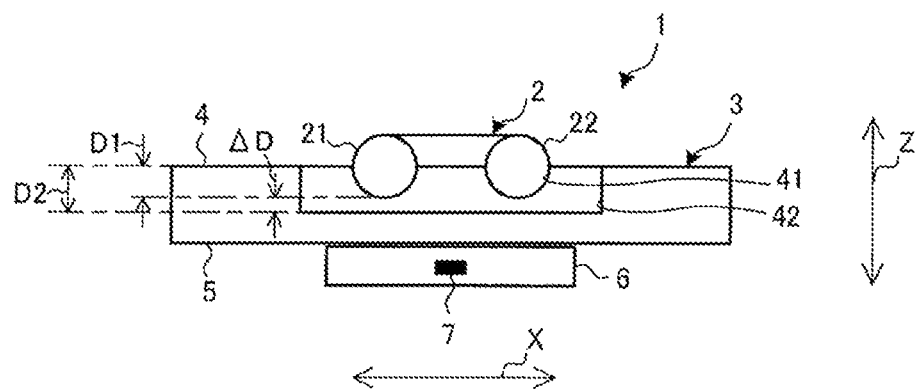
FIG. 3 is a side view of the heat sink 1 according to Embodiment 1 of the present invention with a heat emitting element 6 attached thereto.
Figure 4:
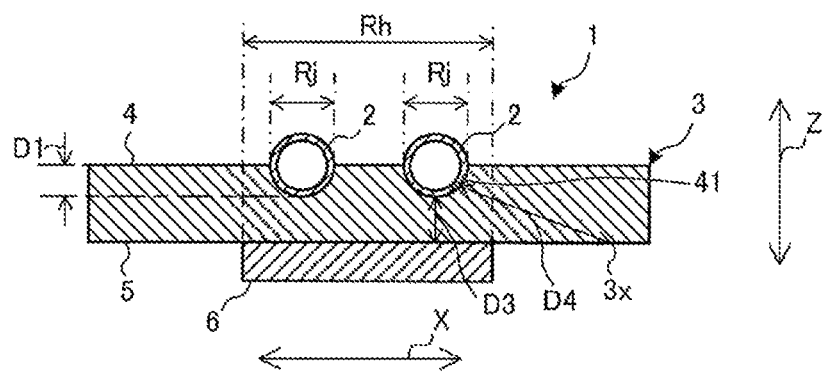
FIG. 4 is a cross-sectional view taken along line A-A in FIG. 2.
Figure 5:
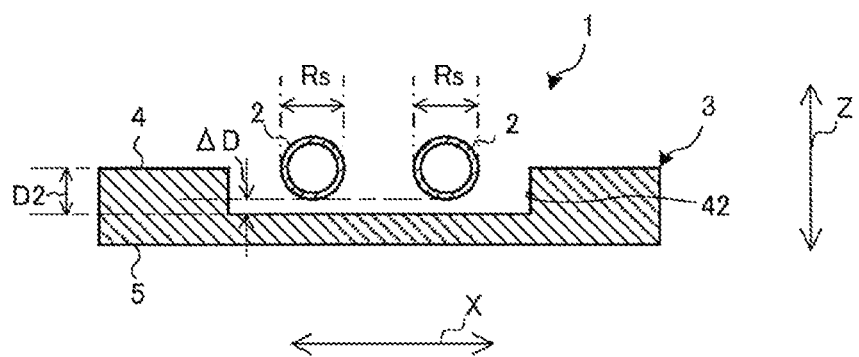
FIG. 5 is a cross-sectional view taken along line B-B in FIG. 2.

FIG. 2 is a plan view illustrating a schematic configuration of the heat sink 1 according to Embodiment 1 of the present invention. FIG. 3 is a side view of the heat sink 1 according to Embodiment 1 of the present invention with the heat emitting element 6 attached thereto. FIG. 4 is a cross-sectional view taken along line A-A in FIG. 2. FIG. 5 is a cross-sectional view taken along line B-B in FIG. 2. The configuration of the heat sink 1 will now be described in detail with reference to FIGS. 2 to 5.

The heat sink 1 includes a pipe 2 and a cooling block 3. The pipe 2 is made of a heat conductive material, such as aluminum or copper. The pipe 2 is a U-shaped cylindrical pipe having a bend 23, and has an inlet port 21 at one end and an outlet port 22 at the other end. The refrigerant flows through the pipe 2 from the inlet port 21 to the outlet port 22 in a direction represented by arrows F. The shape of the pipe 2 is not limited to the above-described U-shape. The pipe 2 may be, for example, a straight pipe, a serpentine pipe having bends 23, or a pipe having branches extending between the inlet port 21 and the outlet port 22.

The cooling block 3 has a first face 4 on which the pipe 2 is placed and a second face 5 to which the heat emitting element 6 is attached. The heat emitting element 6 is attached to central part of the second face 5. The cooling block 3 is a plate-like part made of a heat conductive material, such as aluminum or copper, and conducts heat between the pipe 2 and the heat emitting element 6. The longitudinal and lateral dimensions of the cooling block 3 are set to maintain a required heat capacity. The longitudinal and lateral dimensions are set so that the number of times that the flow control device 223 can be opened and closed in the life span of the heat sink 1 is less than or equal to an allowable number of times and a lifetime temperature cycle of the heat emitting element 6 lies within the bounds of not reducing the life of the heat emitting element 6.

The first face 4 of the cooling block 3 includes contact regions Rj and noncontact regions Rs at positions where the cooling block 3 faces the pipe 2. The first face 4 contacts the pipe 2 in the contact regions Rj and faces the pipe 2 with a gap therebetween in the noncontact regions Rs. The contact regions Rj are located within a projection region Rh defined by projecting a region of attachment of the heat emitting element 6 to the second face 5 onto the first face 4.

As illustrated in FIG. 4, the contact regions Rj each include a placement groove 41 in which the pipe 2 is placed. The placement groove 41 has a depth D1 relative to the first face 4 of the cooling block 3 in an arrow Z direction. The depth D1 is the same dimension as, for example, an outer radius of the pipe 2. The placement groove 41 has an arc cross-sectional shape to provide a sufficient area of contact with the pipe 2. Although two placement grooves 41 are arranged in FIG. 2, the number of placement grooves is set depending on the plan-view shape of the pipe 2 disposed on the cooling block 3. In the use of, for example, a serpentine pipe, three or more placement grooves 41 are arranged. In the use of, for example, a pipe having branches, the placement grooves 41 equal in number to the branches are arranged.

As illustrated in FIG. 5, the noncontact regions Rs are included in each recess 42. The recess 42 has a depth D2 relative to the first face 4 of the cooling block 3 in the arrow Z direction. The depth D2 of the recess 42 is set greater than the depth D1 of the placement groove 41 by a depth ΔD so that the pipe 2 is apart from the cooling block 3. Furthermore, the recess 42 extends from an edge 3a of the cooling block 3 to a position next to the placement grooves 41 in a direction (arrow Y direction) from the inlet port 21 or the outlet port 22 to the bend 23 of the pipe 2.

For the extent of formation of each recess 42 in a direction (arrow X direction) perpendicular to the arrow Y direction in the first face 4, the recess 42 may be formed within a region where the pipe 2 is located or may extend across the first face 4 of the cooling block 3 in the arrow X direction. The extent of formation of the recess 42 may be appropriately determined based on, for example, the required heat capacity and the ease of formation. Although two recesses 42 are arranged in the above description, it is only required that at least one recess 42 is formed. The number of recesses 42 and the position of the recess 42 may be appropriately set based on the position of the heat emitting element 6 and the position of the pipe 2.

When the refrigerant flows into the heat sink 1, cooling energy of the refrigerant is not transmitted to the cooling block 3 in the noncontact regions Rs where the pipe 2 is apart from the recess 42. In the contact regions Rj where the pipe 2 is in contact with the placement grooves 41, the cooling energy of the refrigerant is transmitted to the heat emitting element 6 through the pipe 2 and the cooling block 3, so that the heat emitting element 6 is cooled. In the contact regions Rj, which are located within the projection region Rh, a distance D3 between the pipe 2 and the heat emitting element 6 is shorter than those in other regions. Consequently, most of the cooling energy of the refrigerant is transmitted to the heat emitting element 6, thus sufficiently cooling the heat emitting element 6. In peripheral part 3x of the cooling block 3, a distance D4 from the pipe 2 is longer than the distance D3. This avoids excessive cooling of the second face 5 of the cooling block 3 in the peripheral part 3x to which the heat emitting element 6 is not attached, thereby reducing or eliminating the formation of condensation.

As described above, in Embodiment 1, the contact regions Rj in which the first face 4 is in contact with the pipe 2 and the noncontact regions Rs are arranged at the positions where the cooling block 3 faces the pipe 2. The contact regions Rj are located within the projection region Rh defined by projecting the region of attachment of the heat emitting element 6 onto the first face 4.

This arrangement allows the cooling block 3 to have a capacity in the noncontact regions Rs, thus providing a heat capacity greater than or equal to the required heat capacity. Furthermore, the area of cooling is limited within the projection region Rh. This avoids excessive cooling of the surface of the cooling block 3 in a region other than the region of attachment of the heat emitting element 6. Therefore, the heat sink 1 cools the heat emitting element 6 with certainty while reducing or eliminating the formation of condensation. If an electronic part that generates no heat is attached to the peripheral part 3x of the cooling block 3, reduction or elimination of the formation of condensation on the peripheral part 3x prevents a short in the electronic part that generates no heat. Additionally, the provided heat capacity of the cooling block 3 makes it easy to keep the heat emitting element 6 at a target temperature, resulting in a reduction in temperature undershoot and overshoot. This reduces the number of times of opening and closing of the flow control device 223 and suppresses a reduction in life of the heat emitting element 6.

The contact regions Rj each include the placement groove 41 in which the pipe 2 is placed, and the noncontact regions Rs are included in the recesses 42 each having the depth D2 greater than the depth D1 of the placement groove 41. In this arrangement, placing the pipe 2 in the placement grooves 41 increases the area of contact between the cooling block 3 and the pipe 2, leading to increased thermal conductivity in the contact regions Rj. Although the placement grooves 41 are arranged, the gap between the pipe 2 and the cooling block 3 is provided in the recesses 42. This facilitates arrangement of the contact regions Rj and the noncontact regions Rs in the cooling block 3.

Each contact region Rj may include a plurality of placement grooves 41. This arrangement allows the heat sink 1 to have the area of cooling and the contact regions Rj best suited to the heat emitting element 6 as long as the shape of the pipe 2 and the number of placement grooves 41 are set based on, for example, the amount of heat generated from the heat emitting element 6 and the position at which the heat emitting element 6 is attached.

Each recess 42 extends from the edge 3a of the cooling block 3 to the position next to the contact regions Rj. The recess 42 is easy to form because the recess 42 is formed by cutting away a portion of the cooling block 3 in one direction. For example, the cooling block 3 of FIG. 2 is formed by cutting away portions extending from the edges 3a of the cooling block 3 in the arrow Y direction. In addition, the recess 42 extending across the face in the arrow X direction is formed by cutting away a portion of the cooling block 3 in the arrow X direction.

Embodiment 2

Figure 6:
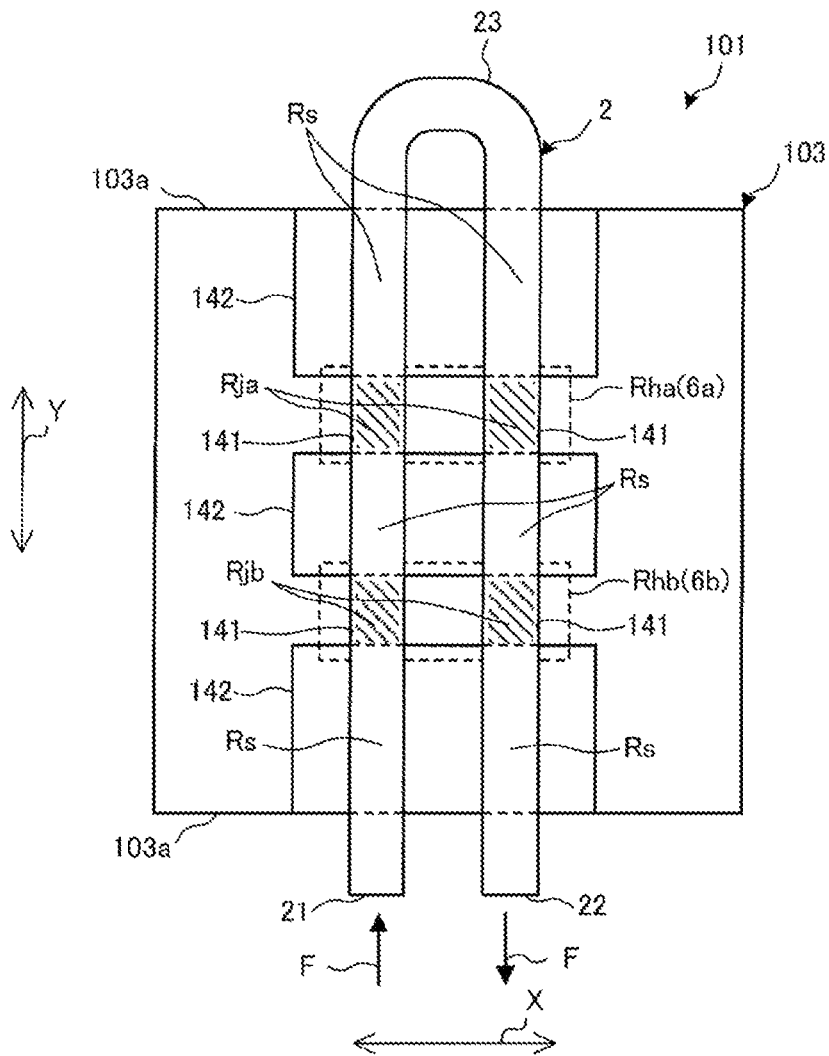
FIG. 6 is a plan view illustrating a schematic configuration of a heat sink 101 according to Embodiment 2 of the present invention.
Figure 7:
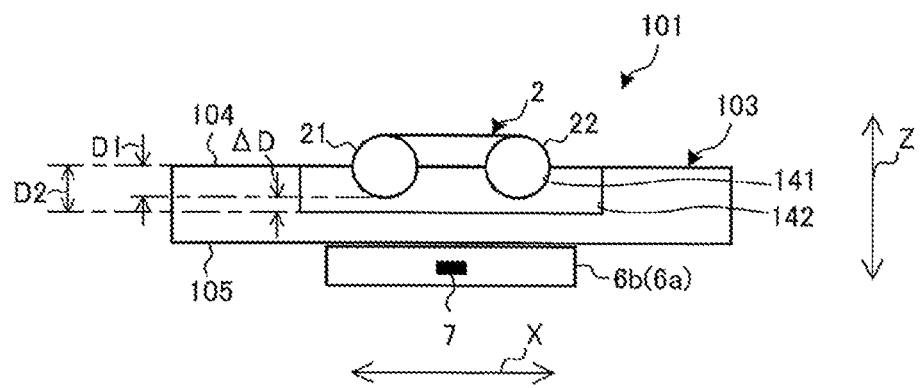
FIG. 7 is a side view of the heat sink 101 according to Embodiment 2 of the present invention with heat emitting elements 6a and 6b attached thereto.

FIG. 6 is a plan view illustrating a schematic configuration of a heat sink 101 according to Embodiment 2 of the present invention. FIG. 7 is a side view of the heat sink 101 according to Embodiment 2 of the present invention with heat emitting elements 6a and 6b attached thereto. The heat sink 101 according to Embodiment 2 will be described with reference to FIGS. 6 and 7. The heat sink 1 according to Embodiment 1 cools one heat emitting element 6, whereas the heat sink 101 according to Embodiment 2 cools the heat emitting elements 6a and 6b. The same components as those in Embodiment 1 are designated by the same reference signs and a description of these components is omitted.

The heat sink 101 includes a cooling block 103 having a second face 105 to which the heat emitting elements 6a and 6b are attached. A projection region Rha is a region defined by projecting a region of attachment of the heat emitting element 6a onto a first face 104. A projection region Rhb is a region defined by projecting a region of attachment of the heat emitting element 6b onto the first face 104.

The projection region Rha of the region of attachment of the heat emitting element 6a includes contact regions Rja. The projection region Rhb of the region of attachment of the heat emitting element 6b includes contact regions Rjb. The contact regions Rja have two placement grooves 141, and the contact regions Rjb have two placement grooves 141. The cooling block 103 has four placement grooves 141 in total. The number of placement grooves 141 in the contact regions Rja and Rjb may be set based on the plan-view shape of the pipe 2 on the cooling block 103.

The first face 104 of the cooling block 103 has three recesses 142, each including noncontact regions Rs. The placement grooves 141 each have the depth D1. The recesses 142 each have the depth D2, which is set greater than the depth D1 of the placement grooves 141 by the depth ΔD so that the pipe 2 is apart from the cooling block 103. The recesses 142 are arranged on opposite ends of the contact regions Rja and/or Rjb arranged for the heat emitting elements 6a and 6b in the arrow Y direction such that each of the recesses 142 is disposed next to the contact regions Rja or the contact regions Rjb. Specifically, the recess 142, the contact regions Rja, the recess 142, the contact regions Rjb, and the recess 142 are arranged in that order in a direction from an edge 103a adjacent to the bend 23 to an edge 103a adjacent to the inlet port 21 and the outlet port 22.

As described above, in Embodiment 2, the contact regions Rja and Rjb are included in the projection regions Rha and Rhb for the heat emitting elements 6a and 6b. This arrangement allows the cooling block 103 to have a capacity in the noncontact regions Rs, thus providing a sufficient heat capacity if the heat emitting elements 6a and 6b are attached to the cooling block 103. Furthermore, the area of cooling is limited within the projection regions Rha and Rhb, thus reducing or eliminating excessive cooling of the peripheral part 3x. Therefore, the heat sink 101 cools the heat emitting elements 6a and 6b with certainty while reducing or eliminating the formation of condensation as in Embodiment 1.

Embodiments of the present invention are not limited to the above-described embodiments. Various modifications can be made. For example, FIG. 1 illustrates the heat sink 1 disposed in the air-conditioning apparatus 400. The heat sink 1 may be disposed in any apparatus including a heat emitting element 6. In the above description, the heat emitting element 6 is cooled with the refrigerant in the refrigerant circuit. The heat emitting element 6 may be cooled with any substance other than the refrigerant, for example, cooled fluid.

In Embodiment 1 described above, the cooling block 3 has the placement grooves 41. As long as the cooling block 3 is in contact with the pipe 2 in the contact regions Rj, the placement grooves 41 may be eliminated. Furthermore, the pipe 2 and the cooling block 3 may be joined together by brazing or may be coupled together by caulking.

In the above description, the electronic part (heat emitting element 6) that generates heat is attached to the heat sink 1. In addition to the heat emitting element 6, an electronic part that generates a little or no heat may be attached to the heat sink 1. In this case, the electronic part that generates a little or no heat is attached to a noncontact region Rs or the peripheral part 3x.

In the above description, the pipe 2 is a cylindrical pipe. A flat pipe may be used. In this case, each placement groove 41 is shaped to fit the cross-sectional shape of the pipe 2. In the above description, the heat emitting element 6 is attached to the central part of the cooling block 3. The heat emitting element 6 may be attached to any position on the cooling block 3. The positions of the contact regions Rj and the noncontact regions Rs are set based on the position where the heat emitting element 6 is attached.

The invention claimed is:

1. A heat sink comprising:
a pipe through which cooled fluid flows; and
a cooling block having a first face on which the pipe is placed and a second face to which at least one heat emitting element is attached,
wherein the cooling block has a contact region and a noncontact region at positions where the cooling block faces the pipe,
wherein in the contact region, the first face contacts the pipe,
wherein the noncontact region is defined by a recess in the first face, and
wherein in the noncontact region, there is an empty vertical space between a bottom of the recess and the pipe.

2. The heat sink of claim 1,
wherein the contact region is included in a projection region defined by projecting a region of attachment of the heat emitting element onto the first face.

3. The heat sink of claim 1,
wherein the contact region includes at least one placement groove in which the pipe is placed, and
wherein the recess has a depth greater than that of the placement groove.

4. The heat sink of claim 3,
wherein the at least one placement groove of the contact region comprises a plurality of placement grooves.

5. The heat sink of claim 3,
wherein the recess extends from an edge of the cooling block to a position next to the contact region.

6. The heat sink of claim 2,
wherein the at least one heat emitting element attached to the cooling block comprises a plurality of heat emitting elements disposed intermittently below the cooling block, and
wherein the contact region is included in each of a plurality of projection regions corresponding one-to-one to the plurality of heat emitting elements.

* * * * *